(12) United States Patent
Shiota et al.

(10) Patent No.: US 11,158,658 B2
(45) Date of Patent: Oct. 26, 2021

(54) RADIATION DETECTOR

(71) Applicant: SHARP KABUSHIKI KAISHA, Sakai (JP)

(72) Inventors: Masahiro Shiota, Sakai (JP); Shigenari Taguchi, Sakai (JP); Takahiro Shindoh, Sakai (JP); Kunihiko Iizuka, Sakai (JP); Nobuyuki Ashida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/435,832

(22) Filed: Jun. 10, 2019

(65) Prior Publication Data

US 2019/0386045 A1    Dec. 19, 2019

Related U.S. Application Data

(60) Provisional application No. 62/686,794, filed on Jun. 19, 2018.

(51) Int. Cl.
*H01L 27/146* (2006.01)
*G01T 1/20* (2006.01)

(52) U.S. Cl.
CPC .. *H01L 27/14614* (2013.01); *H01L 27/14616* (2013.01); *H01L 27/14643* (2013.01); *G01T 1/2018* (2013.01)

(58) Field of Classification Search
CPC ......... H01L 27/14614; H01L 27/14643; H01L 27/14616; H01L 27/14658; H01L 27/14659; H01L 27/14612; H01L 27/14636; G01T 1/2018
See application file for complete search history.

(56) References Cited

U.S. PATENT DOCUMENTS

| | | | | |
|---|---|---|---|---|
| 7,842,985 B2 * | 11/2010 | Lim | ......... | H01L 27/14689 257/291 |
| 10,367,024 B2 * | 7/2019 | Nah | ......... | H01L 27/14603 |
| 2013/0075593 A1 * | 3/2013 | Williams, Jr. | ..... | H01L 27/14636 250/208.1 |
| 2014/0034945 A1 * | 2/2014 | Tokunaga | ......... | H01L 21/02554 257/43 |
| 2014/0264506 A1 * | 9/2014 | Kuo | ......... | H01L 27/14609 257/292 |

(Continued)

FOREIGN PATENT DOCUMENTS

| JP | 2015-026828 A | 2/2015 |
|---|---|---|
| JP | 2015-065433 A | 4/2015 |
| JP | 2016-122732 A | 7/2016 |

OTHER PUBLICATIONS

Karim S. Karim, et. al., Amorphous Silicon Active Pixel Sensor Readout Circuit for Digital Imaging, IEEE Transactions on Electron Devices, P200208, vol. 50, No. 1, Jan. 2003.

(Continued)

*Primary Examiner* — Marcus H Taningco
(74) *Attorney, Agent, or Firm* — ScienBiziP, P.C.

(57) ABSTRACT

[Object] To achieve a radiation detector capable of suppressing variation in the amount of radiation detected.

[Solution] A first gate electrode (52) is connected to a light receiving device, and a second gate electrode (53) is configured to have the same potential as that of the first gate electrode (52).

4 Claims, 17 Drawing Sheets

(56) References Cited

U.S. PATENT DOCUMENTS

| | | | |
|---|---|---|---|
| 2014/0374745 A1 | 12/2014 | Takahashi et al. | |
| 2015/0060675 A1 | 3/2015 | Akimoto et al. | |
| 2017/0092673 A1* | 3/2017 | Miyamoto | H01L 27/14609 |
| 2019/0027092 A1* | 1/2019 | Matsueda | H01L 27/1255 |
| 2019/0123080 A1* | 4/2019 | Kanicki | H01L 27/308 |

OTHER PUBLICATIONS

Edward Namkyu Cho, et. al., Analysis of Bias Stress Instability in Amorphous InGaZnO Thin-Film Transistors, IEEE Transactions on Device and Materials Reliability, p. 112-117, vol. 11, No. 1, Mar. 2011.

Takuya Matsuo, Sharp Technical Journal, No. 104, p. 13-17, Sep. 2012.

* cited by examiner

| 1: PHOTODIODE | 4: RESET TRANSISTOR |
| 2: READ TRANSISTOR | 102: RADIATION DETECTOR |
| 3: AMPLIFYING TRANSISTOR | 111: MEASURING CIRCUIT |

RADIATION DETECTOR

TECHNICAL FIELD

The present invention relates to a radiation detector.

BACKGROUND ART

During these years, transmission image display apparatuses that employ radiation such as X rays are beginning to generate stereoscopic images based on multidirectional transmission images by radiating radiation from multiple directions. Detection of breast cancer through digital breast tomosynthesis (DBT), for example, has been proposed. DBT is a technique for collecting X-ray images of the breast from a large number of different directions by turning around an X-ray tube relative to a radiation detector with the breast compressed. Since a plurality of X-ray images need to be obtained by radiating X-rays from multiple directions in this technique, the amount of X-rays radiated in each imaging operation is limited. In addition, since a cancer detection rate depends on the quality of X-ray images, it is desired in this technique to obtain higher-resolution images.

NPL 1 discloses an imaging apparatus that includes a transistor for which an In (indium)-Ga (gallium)-Zn (zinc) oxide semiconductor (hereinafter referred to as IGZO) is used and that obtains images using radiation such as X-rays.

The mobility of IGZO is more than 20 times higher than that of amorphous silicon, which is generally used for transistors of image obtaining apparatuses, and the leak current of IGZO is less than one thousandth of that of amorphous silicon. By using IGZO, therefore, smaller transistors can be formed. As a result, a light receiving area can be secured even if light receiving devices that receive light obtained from radiation are fabricated densely, and an apparatus capable of obtaining high-resolution images with a small amount of radiation can be developed.

Radiation images are obtained by using a scintillator that emits light in response to radiation and detecting the emitted light using photoelectric devices. A radiation detector, which is a light detection circuit, is usually a PPS (passive pixel sensor) or an APS (active pixel sensor).

FIG. 13 is a circuit diagram illustrating an example of a PPS 300 according to a conventional technique. FIG. 14 is a diagram illustrating an example of a cross-sectional structure of the PPS 300 illustrated in FIG. 13.

As illustrated in FIG. 13, the PPS 300 is made up of a photodiode 201 and a read transistor 202. The photodiode 201 converts emitted light into charge, and the read transistor 202 turns on to transfer the charge to a measuring circuit 301, which then measures the amount of light emitted.

As illustrated in FIG. 14, the PPS 300 includes a glass substrate 251, a gate electrode 252, a channel layer 254, a source electrode 255, a drain electrode 256, insulating films 257 to 262, a photodiode lower electrode layer 263, a photodiode main layer 264, a photodiode upper electrode layer 265, and an upper wiring electrode 266.

FIG. 15 is a circuit diagram illustrating an example of an APS 500 according to a conventional technique. FIG. 16 is a diagram illustrating an example of a cross-sectional structure of the APS 500 illustrated in FIG. 15.

As illustrated in FIG. 15, the APS 500 is made up of a photodiode 401, a read transistor 402, an amplifying transistor 403, and a reset transistor 404. At least the amplifying transistor 403 is formed by a TFT (thin film transistor). The photodiode 401 converts emitted light into charge, and the gate potential of the amplifying transistor 403 is changed by the charge. The change in the gate potential is amplified as a current from the amplifying transistor 403. The read transistor 402 turns on to transfer the change to a measuring circuit 501, which then measures the amount of light emitted.

As illustrated in FIG. 16, the APS 500 includes a glass substrate 451, a gate electrode 452, a channel layer 454, a source electrode 455, a drain electrode 456, insulating films 457 to 462, a photodiode lower electrode layer 463, a photodiode main layer 464, a photodiode upper electrode layer 465, and an upper wiring electrode 466.

Whereas the PPS 300 uses the read transistor 202 to transfer charge generated in the photodiode 201 to the measuring circuit 301 as it is, the APS 500 uses the amplifying transistor 403. The APS 500, therefore, can measure the amount of light emitted even with a small amount of charge.

NPL 2 discloses that the threshold voltage of a TFT whose channel layer is amorphous InGaZnO is affected by a bias applied to a gate. The APS 500 uses the amplifying transistor 403 as an amplifying circuit. Variation in the threshold voltage of the amplifying transistor 403 leads to variation in an amplification factor of the amplifying transistor 403, that is, variation in characteristics of the APS 500. Because such variation can lead to a failure in displaying images for an apparatus that generates images using a large number of APSs 500, the variation needs to be suppressed.

NPL 3 proposes use of IGZO (CAC-IGZO), not amorphous InGaZnO, having a crystal structure strongly oriented along a c-axis in a channel film growth direction as a channel layer of a TFT. NPL 3 discloses that, in doing so, fluctuation in threshold voltage due to a voltage (stress) applied to a gate is reduced.

CITATION LIST

Non Patent Literature

[NPL 1] Amorphous Silicon Active Pixel Sensor Readout Circuit for Digital Imaging, IEEE Transactions on Electron Devices, P200208, Vol. 50, No. 1, January 2003

[NPL 2] Analysis of Bias Stress Instability in Amorphous InGaZnO Thin-Film Transistors, IEEE Transactions on Device and Materials Reliability, p. 112-117, Vol. 11, No. 1, March 2011

[NPL 3] Sharp Technical Journal, No. 104, p. 13-17, September 2012

SUMMARY OF INVENTION

Technical Problem

In general, variation and fluctuation in threshold voltage need to be suppressed in order to use a TFT as the amplifying transistor 403.

As a method for suppressing variation and fluctuation in a threshold of a transistor, fixing of a back gate is known. FIG. 17 illustrates data obtained by measuring variation in a threshold voltage Vth of a TFT whose channel layer is an oxide semiconductor oriented along the c-axis when the surface potential (back gate potential) of the TFT is fixed and when the surface potential is not fixed. 3 sigma is about ±0.60 V when the surface potential of the TFT is not fixed and about ±0.35 V when the surface potential of the TFT is fixed. As described in NPL 3, threshold voltage is more stable when a channel layer of an oxide semiconductor TFT is oriented along the c-axis than when the channel layer is amorphous. FIG. 17 illustrates effectiveness of the fixing of the surface potential for a TFT whose channel is a c-axis oriented oxide semiconductor. That is, the surface potential of the amplifying transistor 403 may be fixed in order to suppress variation and fluctuation in the threshold voltage of the amplifying transistor 403.

None of NPL 1, NPL 2, and NPL 3, however, specifies how to fix the surface potential of the amplifying transistor 403 in the APS 500 and how to give a potential.

It can thus be seen that the techniques disclosed in NPL 1, NPL 2, and NPL 3 pose a problem that variation in the amount of radiation detected by a radiation detector might be caused.

An aspect of the present invention aims to achieve a radiation detector capable of suppressing variation in the amount of radiation detected.

Solution to Problem (1) An embodiment of the present invention is a radiation detector including a light receiving device that receives light obtained from radiation and that converts the light into an electrical signal and an amplifying transistor that amplifies the electrical signal. The amplifying transistor includes a channel layer and a first gate electrode and a second gate electrode that sandwich the channel layer. The first gate electrode is connected to the light receiving device. The second gate electrode is configured to have a same potential as a potential of the first gate electrode.

(2) Another embodiment of the present invention is the radiation detector according to (1) in which the light receiving device is a photodiode.

(3) Another embodiment of the present invention is the radiation detector according to (2) further including a substrate for which the photodiode and the amplifying transistor are provided. The photodiode includes at least two layers doped with different impurities. The first gate electrode is connected to, between the at least two layers, a layer closer to the substrate.

(4) Another embodiment of the present invention is the radiation detector according to (2) further including a substrate for which the photodiode and the amplifying transistor are provided. The photodiode includes at least two layers doped with different impurities. The first gate electrode is connected to, between the at least two layers, a layer farther from the substrate.

(5) Another embodiment of the present invention is the radiation detector according to (3) or (4) in which the amplifying transistor is formed on the substrate.

(6) Another embodiment of the present invention is the radiation detector according to any of (1) to (5) in which the channel layer includes an oxide semiconductor having a non-amorphous crystal structure.

(7) An embodiment of the present invention is the radiation detector according to any of (1) to (6) in which constituent elements of the channel layer include at least indium and zinc.

Advantageous Effects of Invention

According to an aspect of the present invention, variation in the amount of radiation detected can be suppressed.

DESCRIPTION OF EMBODIMENTS

[Assumed Configuration]

Figure 1:
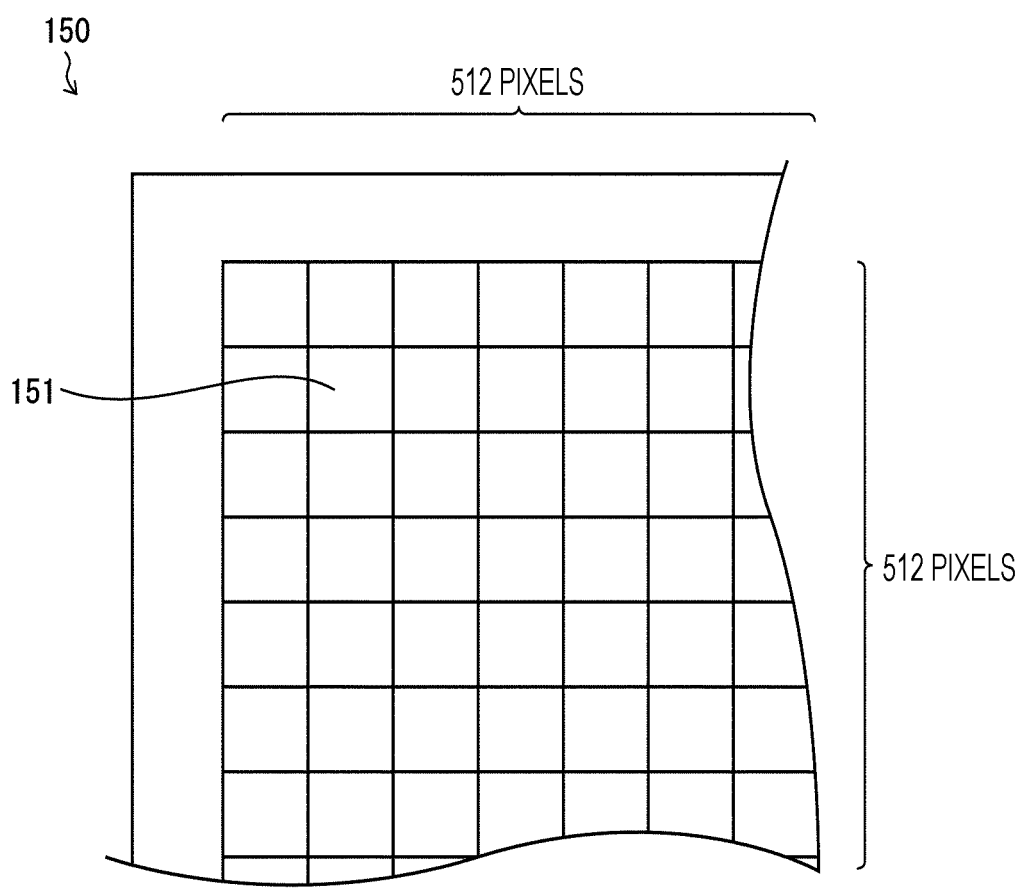
FIG. 1 is a plan view of a sensor according to the present invention.

FIG. 1 is a plan view of a sensor 150 according to the present invention. Although not illustrated in FIG. 1 according to circumstances, the sensor 150 is made up of an array in which a plurality of (e.g., 512×512) pixels 151 are arranged and a scintillator that covers the entirety of the array. The scintillator has a function of receiving radiation (X rays, etc.) and converting the received radiation into light whose amount corresponds to that of the radiation.

Figure 2:
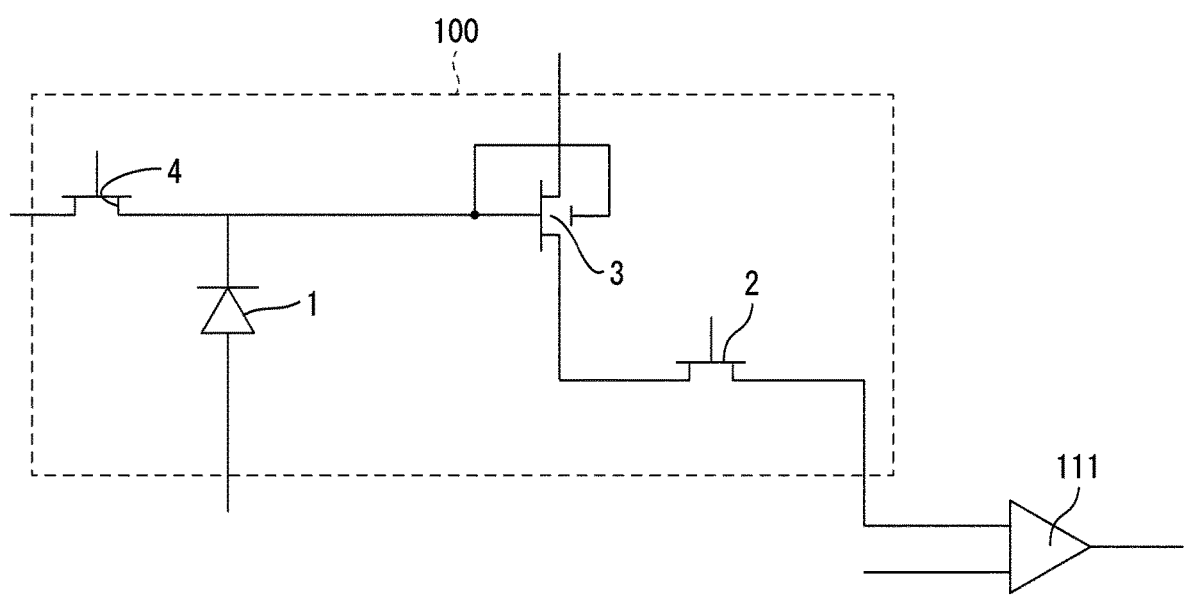
FIG. 2 is a circuit diagram illustrating the configuration of a radiation detector according to the present invention.

FIG. 2 is a circuit diagram illustrating the configuration of a radiation detector 100 according to the present invention. The radiation detector 100 corresponds to one of the pixels 151. The radiation detector 100 is an APS including a photodiode 1, a read transistor 2, an amplifying transistor 3, and a reset transistor 4. FIG. 2 illustrates a measuring circuit 111 in addition to the radiation detector 100. A cathode of the photodiode 1 is connected to a node between the amplifying transistor 3 and the reset transistor 4.

The photodiode 1 generates charge from received light. The read transistor 2 is a switch that connects the amplifying transistor 3 and the measuring circuit 111 with each other. The amplifying transistor 3 outputs a current proportional to the charge generated by the photodiode 1. The reset transistor 4 is used to reset the charge generated by the photodiode 1.

The above description can be paraphrased as follows. The photodiode 1 is a light receiving device that receives light (light obtained from radiation) from the scintillator and that converts the light into an electrical signal. The amplifying transistor 3 amplifies the electrical signal. The read transistor 2 is a switch connected between the amplifying transistor 3 and the measuring circuit 111 and controls a timing at which the electrical signal amplified by the amplifying transistor 3 is supplied to the measuring circuit 111.

The measuring circuit 111 then obtains the amount of the light received by the photodiode 1 on the basis of a level of the electrical signal amplified by the amplifying transistor 3. As a result, the amount of radiation can be detected for each pixel 151. The measuring circuit 111 is, for example, a comparator having an input terminal to which the electrical signal amplified by the amplifying transistor 3 is supplied and another input terminal to which a reference voltage is supplied. The configuration of the measuring circuit ill, however, is not limited to this.

First Embodiment

Figure 3:
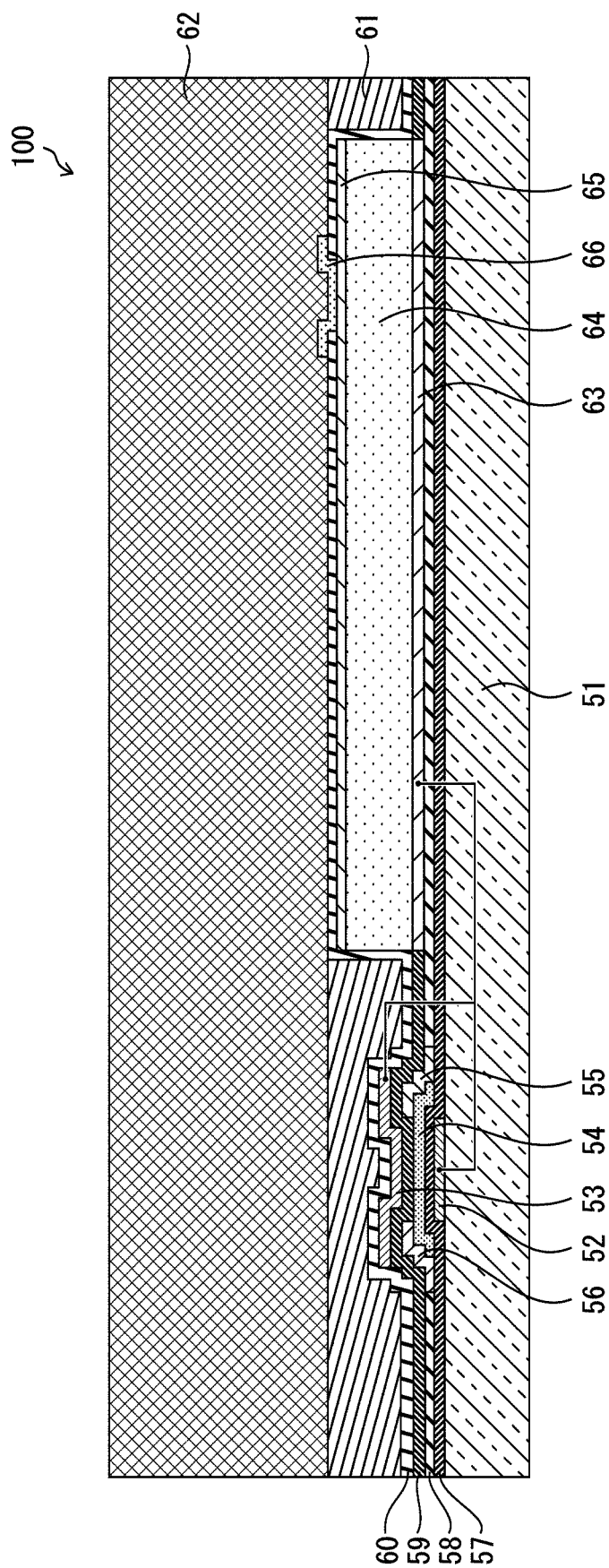
FIG. 3 is a diagram illustrating a cross-sectional structure of a radiation detector according to a first embodiment of the present invention.

FIG. 3 is a diagram illustrating a cross-sectional structure of the radiation detector 100 according to a first embodiment of the present invention. The radiation detector 100 includes a glass substrate 51, a first gate electrode 52, a second gate electrode 53, a channel layer 54, a source electrode 55, a drain electrode 56, insulating films 57 to 62, a photodiode lower electrode layer 63, a photodiode main layer 64, a photodiode upper electrode layer 65, and a wiring electrode 66. The photodiode lower electrode layer 63, the photodiode main layer 64, and the photodiode upper electrode layer 65 correspond to the photodiode 1. The first gate electrode 52, the second gate electrode 53, the channel layer 54, the source electrode 55, and the drain electrode 56 correspond to the amplifying transistor 3.

The first gate electrode 52 is provided on the glass substrate 51. The insulating film 57 is provided in such a way as to cover the glass substrate 51 and the first gate electrode 52. The channel layer 54 is stacked on the insulating film 57 and provided above the first gate electrode 52. The source electrode 55 and the drain electrode 56 are stacked on the channel layer 54 and the insulating film 57 near the channel layer 54. The insulating film 58 is stacked on the insulating film 57. The insulating film 59 is provided in such a way as to cover a part of the insulating film 58, the channel layer 54, the source electrode 55, and the drain electrode 56. The photodiode lower electrode layer 63 is stacked on the insulating film 58. The photodiode main layer 64 is stacked on the photodiode lower electrode layer 63. The photodiode upper electrode layer 65 is stacked on the photodiode main layer 64. The wiring electrode 66 is provided on the photodiode upper electrode layer 65 and connected to the photodiode upper electrode layer 65. The second gate electrode 53 is stacked on the insulating film 59 and provided above the channel layer 54, the source electrode 55, and the drain electrode 56. The insulating film 60 is provided in such a way as to cover the second gate electrode 53, the insulating film 59, and the photodiode upper electrode layer 65. The insulating film 61 is provided in such a way as to cover the insulating film 60 and avoid an area above the photodiode upper electrode layer 65. The insulating film 62 is provided in such a way as to cover the entirety of the above-described multilayer structure.

Here, the photodiode lower electrode layer 63 is connected to the first gate electrode 52. The photodiode lower electrode layer 63 is also connected to the second gate electrode 53. In other words, the second gate electrode 53 is configured to have the same potential as that of the first gate electrode 52. In the radiation detector 100, the potentials of the first gate electrode 52 and the second gate electrode 53 are set the same as that of the photodiode lower electrode layer 63.

In the radiation detector 100, the second gate electrode 53 functions as a back gate of the amplifying transistor 3. As a result, a threshold voltage of the amplifying transistor 3 becomes stable, and variation in the amount of radiation detected by the radiation detector 100 can be suppressed.

The surface potential of a TFT needs to be fixed in order to reduce variation in the threshold voltage of the TFT. In order to fix the surface potential of a TFT, an electrode needs to be provided above the TFT.

If the potential of an electrode above a TFT is set the same as that of an electrode of a photodiode, the potential of the electrode above the TFT cannot be fixed due to the configuration of the TFT and the photodiode because charge is caused in the photodiode when the photodiode receives light. As a result, the threshold voltage of the TFT is undesirably affected. That is, even if an electrode or the like is provided above a TFT and the potential of the electrode becomes the same as that of an electrode of a photodiode, the potential cannot be fixed or controlled. The fixing of a potential herein refers to fixing of an end potential of a channel of a TFT opposite a gate.

Figure 4:
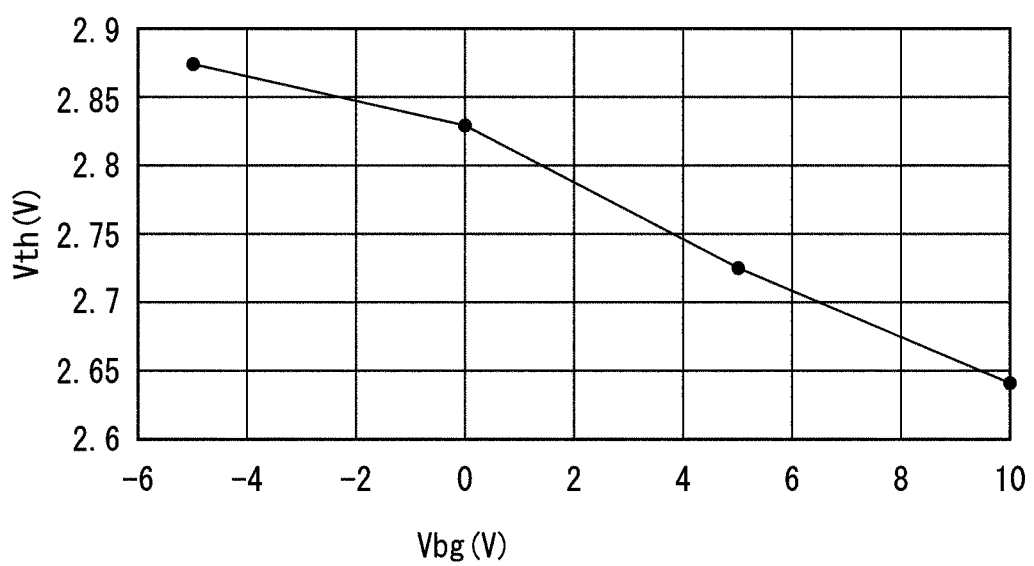
FIG. 4 is a graph illustrating an example of back gate potential dependence of the threshold voltage of a TFT at a time when the potential end potential of a channel opposite a gate of the TFT is changed regardless of gate potential.
Figure 17:
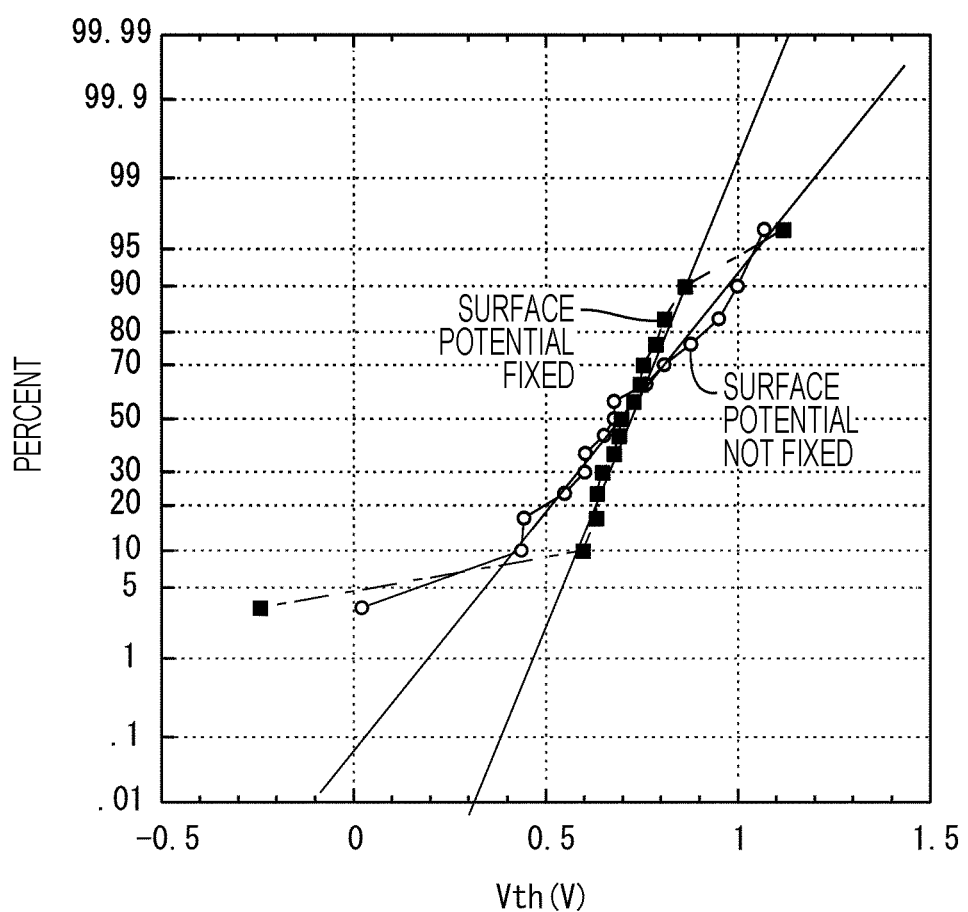
FIG. 17 is a graph illustrating data obtained by measuring variation in the threshold voltage of a TFT whose channel layer is an oxide semiconductor oriented along a c-axis when the surface potential of the TFT is fixed and when the surface potential is not fixed.

FIG. 4 illustrates an example of back gate potential dependence of a threshold voltage Vth of a TFT at a time when the potential end potential of a channel of the TFT opposite a gate is changed regardless of gate potential. It can be seen in FIG. 4 that a back gate potential (the potential end potential of the channel opposite the gate) Vbg of the TFT affects the threshold voltage Vth. In addition, it can be seen in FIG. 17 that the threshold voltage Vth varies if an electrode that functions as a back gate is not provided for a TFT. Even if such an electrode is provided, the threshold voltage Vth is affected by fluctuation in the back gate potential Vbg (refer to FIG. 4).

In the case of a PPS, a TFT is only used as a switch, and fluctuation in threshold voltage hardly affects panel operation and characteristics. TFTs are therefore widely used for PPSs. This holds true for both a case where an electrode that functions as a back gate is not provided for a TFT and a case where such an electrode is provided but the potential thereof cannot be fixed or controlled.

In the case of an APS employing a TFT as an amplifying transistor, on the other hand, requirements relating to fluctuation in characteristics including the threshold voltage of the TFT are incomparably stricter than in the case of a PPS. With the radiation detector 100, stable threshold voltage can be achieved for the amplifying transistor 3 having strict requirements relating to fluctuation in characteristics.

The potential of the amplifying transistor 3 cannot be fixed, either, if the potential of the second gate electrode 53 is set the same as that of an electrode of the photodiode 1. If both the potential of the first gate electrode 52 and the potential of the second gate electrode 53 are set the same as that of the electrode of the photodiode 1, however, the potentials of the first gate electrode 52 and the second gate electrode 53 always remain the same. In other words, these potentials are completely synchronized with each other.

Next, differences between a back gate of a common transistor and the second gate electrode 53 will be described.

A common transistor is usually designed to fix the potential end potential of a channel opposite a gate so that the potential end potential does not fluctuate unexpectedly. In general, an electrode that can be controlled from the outside is provided.

The potential of the second gate electrode 53, on the other hand, is the same as that of the electrode of the photodiode 1, that is, the potential of the second gate electrode 53 fluctuates as charge is accumulated in the photodiode 1. In other words, back gate potential fluctuates. Since the potential of the second gate electrode 53 is the same as that of the first gate electrode 52, however, the following two advantages are achieved. The threshold voltage of the amplifying transistor 3 becomes stable because of these advantages.

Unintended fluctuation in the potential end potential of a channel opposite a gate due to absence of a back gate can be suppressed.

Although the potential end potential of the channel opposite the gate cannot be fixed at a certain voltage, the potential end potential can be constantly set the same as gate potential.

Because the second gate electrode 53 is not controlled from the outside, no wire to the outside needs to be provided, and the second gate electrode 53 can operate with internal wiring of each pixel 151. As a result, the second gate electrode 53 can be fabricated with a simple configuration.

If the second gate electrode 53 and the electrode of the photodiode 1 are integrated together, the second gate electrode 53 can be fabricated with a simpler configuration, details of which will be described later.

In the case of the radiation detector 100 employing a TFT as the amplifying transistor 3, fluctuation in the threshold voltage of the amplifying transistor 3 is a major problem that affects stable operation of the sensor 150. An idea for solving the problem, however, has not been proposed for a TFT formed on a glass substrate included in a conventional PPS or APS. In the radiation detector 100, (1) the potential end potential of the channel opposite the first gate electrode 52 is set the same as the potential of the first gate electrode 52, and (2) an oxide semiconductor having an atomic arrangement non-amorphous in a channel growth direction, that is, an atomic arrangement oriented along a c-axis, is used for the channel layer 54 in an APS employing the amplifying transistor 3 formed on the glass substrate 51. As a result, with the radiation detector 100, the problem of fluctuation in the threshold voltage of the amplifying transistor 3 is solved for the first time, and the sensor 150 can operate stably.

In some of later embodiments, the potentials of the first gate electrode 52 and the second gate electrode 53 are set the same as that of the photodiode upper electrode layer 65. In those embodiments, too, the same point of view in a mode in which the potentials of the first gate electrode 52 and the second gate electrode 53 are set the same as that of the photodiode lower electrode layer 63 applies.

Second Embodiment

Figure 5:
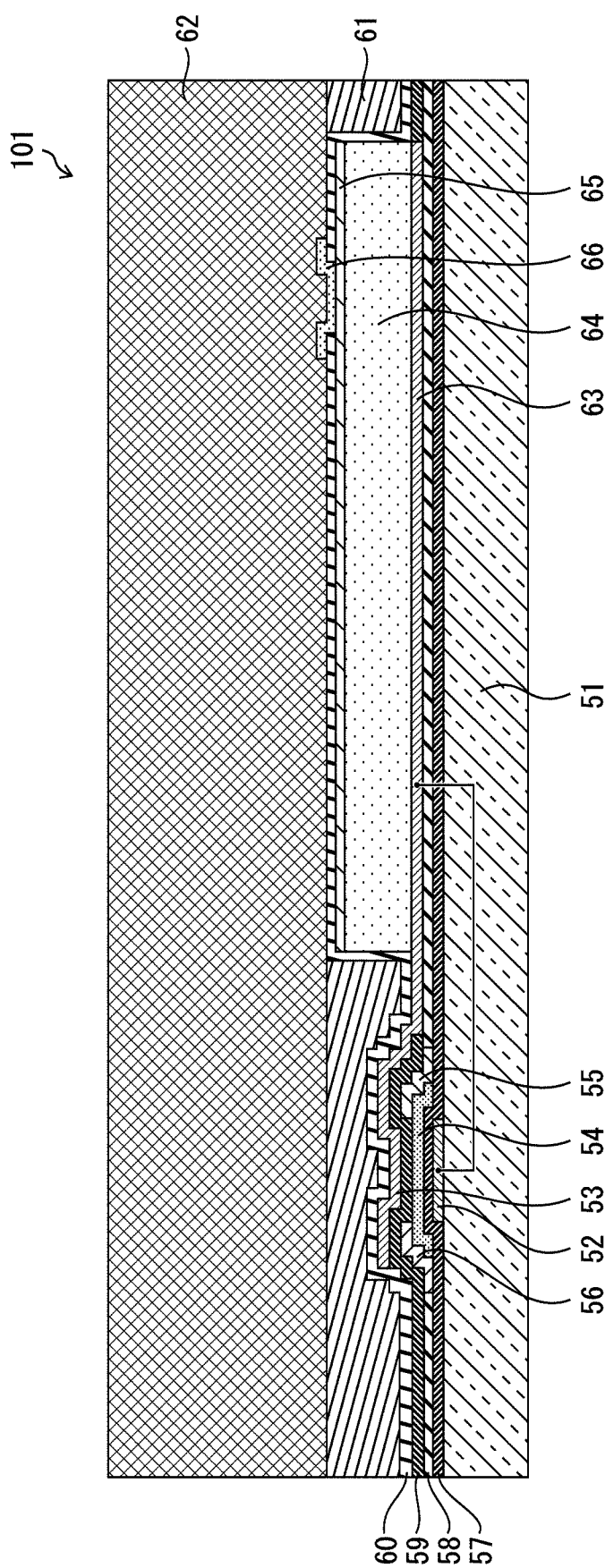
FIG. 5 is a diagram illustrating a cross-sectional structure of a radiation detector according to a second embodiment of the present invention.

FIG. 5 is a diagram illustrating a cross-sectional structure of a radiation detector 101 according to a second embodiment of the present invention.

In the radiation detector 100, the first gate electrode 52, the second gate electrode 53, and the photodiode lower electrode layer 63 are connected to one another by wire. In the radiation detector 101, whereas the first gate electrode 52 and the photodiode lower electrode layer 63 are connected to each other by wire, the second gate electrode 53 and the photodiode lower electrode layer 63 are integrated together.

With the radiation detector 101, the second gate electrode 53 can be fabricated with a simple configuration.

Third Embodiment

Figure 6:
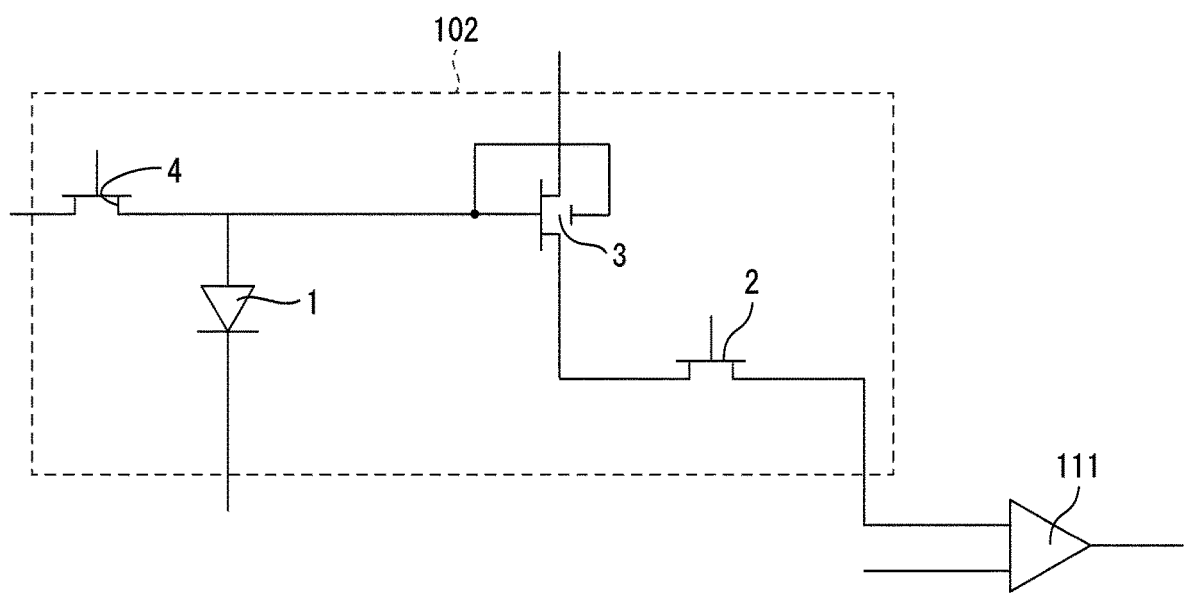
FIG. 6 is a circuit diagram illustrating the configuration of a radiation detector according to a third embodiment of the present invention.
Figure 7:
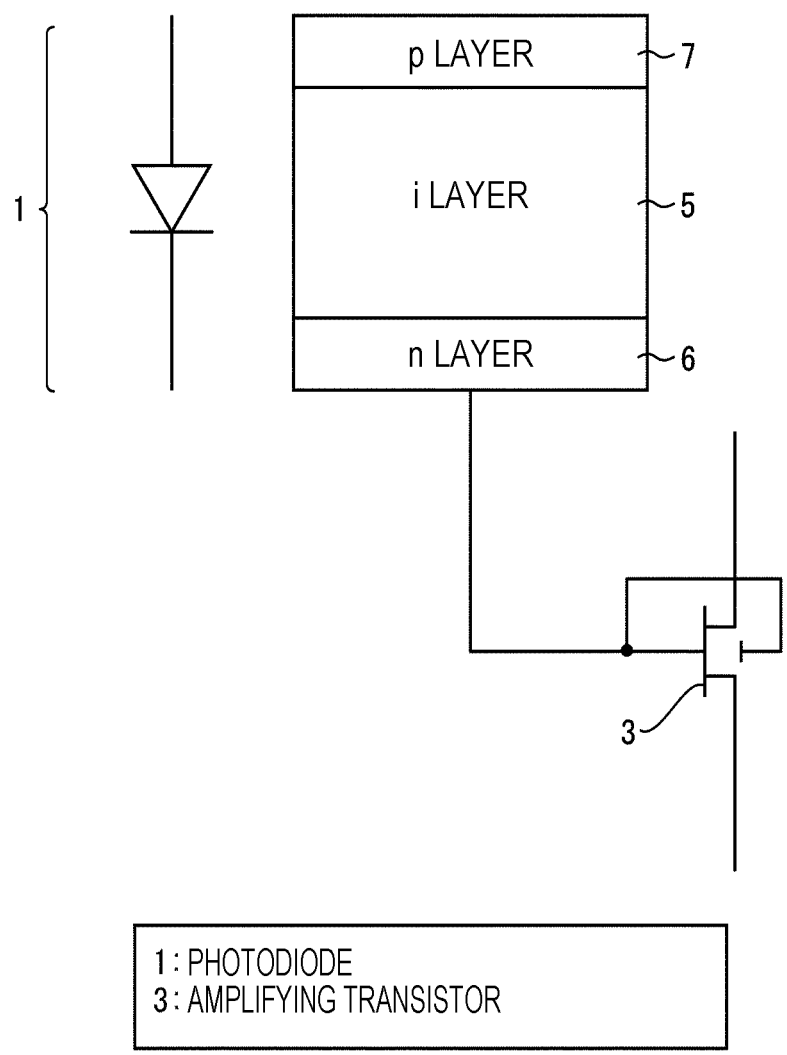
FIG. 7 is an image diagram illustrating a connection relationship between a photodiode and a gate of an amplifying transistor in the radiation detector illustrated in FIG. 2.
Figure 8:
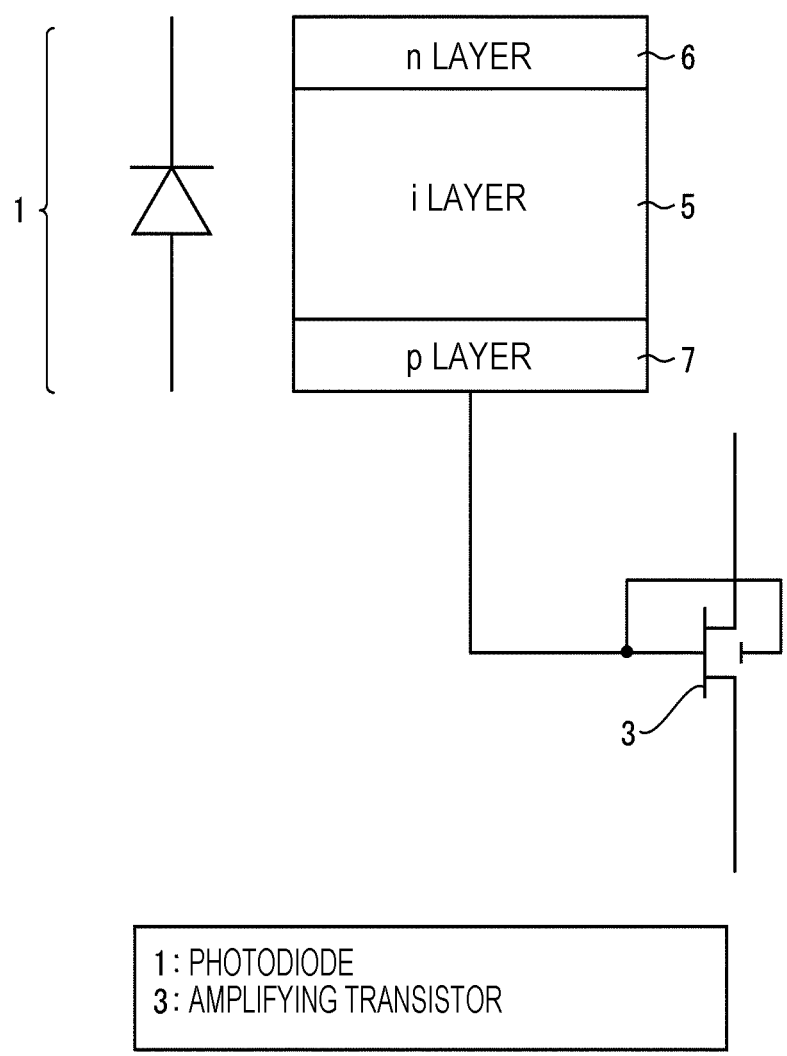
FIG. 8 is an image diagram illustrating a connection relationship between a photodiode and an amplifying transistor in the radiation detector illustrated in FIG. 6.

FIG. 6 is a circuit diagram illustrating the configuration of a radiation detector 102 according to a third embodiment of the present invention. FIG. 7 is an image diagram illustrating a connection relationship between the photodiode 1 and the gate of the amplifying transistor 3 in the radiation detector 100. FIG. 8 is an image diagram illustrating a connection relationship between the photodiode 1 and the amplifying transistor 3 in the radiation detector 102. Whereas the cathode of the photodiode 1 and the gate of the amplifying transistor 3 are connected to each other in the radiation detector 100, an anode of the photodiode 1 and the gate of the amplifying transistor 3 are connected to each other in the radiation detector 102.

The photodiode 1 is composed of a doped semiconductor. More specifically, the photodiode 1 is obtained by sandwiching an i layer 5, which does not include an impurity, with an n layer 6 in which electrons doped with phosphorus or the like are used as carriers and a p layer 7 in which holes doped with boron are used as carriers. Because holes are accumulated in the p layer 7 and electrons are accumulated in the n layer 6, either the radiation detector 102 or the radiation detector 100 is achieved by connecting the p layer 7 or n layer 6 to the gate of the amplifying transistor 3.

If the n layer 6 is connected to the gate of the amplifying transistor 3 as illustrated in FIG. 7, the photodiode lower electrode layer 63 is provided in the n layer 6.

If the p layer 7 is connected to the gate of the amplifying transistor 3 as illustrated in FIG. 8, the photodiode lower electrode layer 63 is provided in the p layer 7.

Fourth Embodiment

Figure 9:
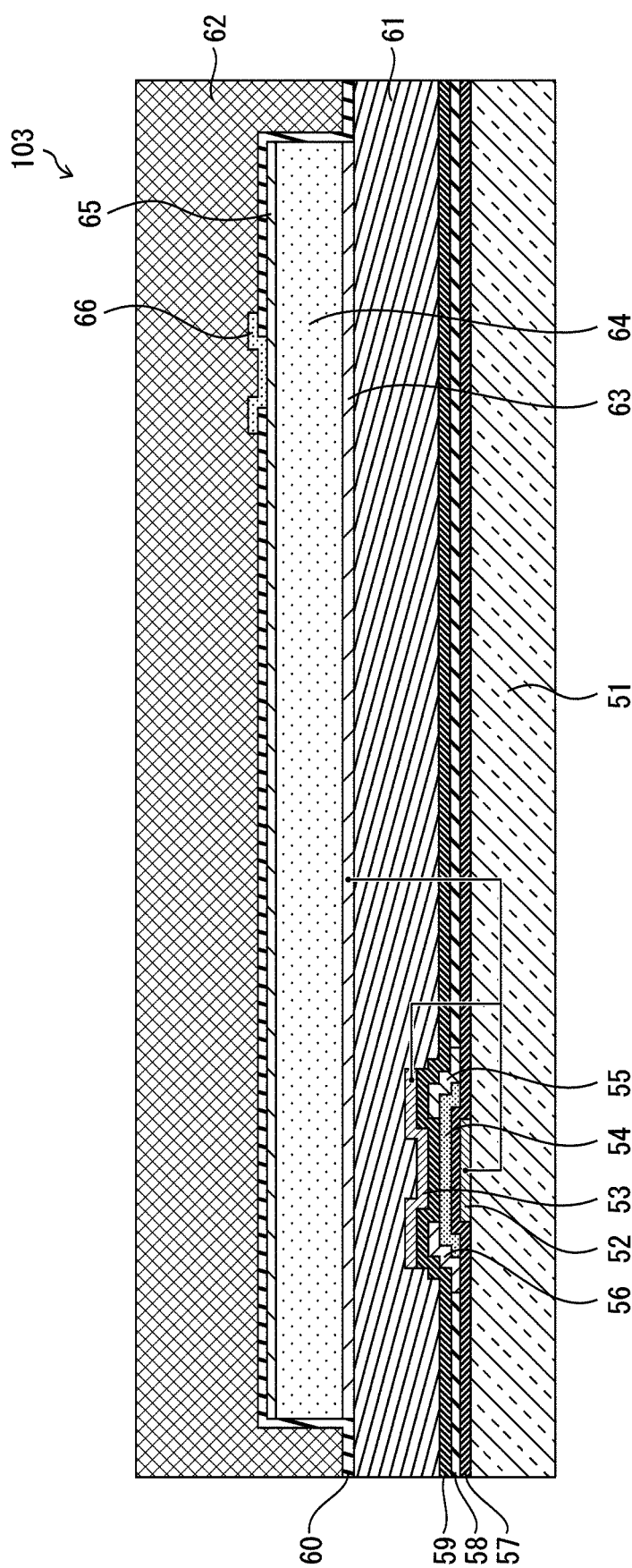
FIG. 9 is a diagram illustrating a cross-sectional structure of a radiation detector according to a fourth embodiment of the present invention.

FIG. 9 is a diagram illustrating a cross-sectional structure of a radiation detector 103 according to a fourth embodiment of the present invention.

A notable difference between the cross-sectional structure of the radiation detector 103 and the cross-sectional structure of the radiation detector 100 is that the photodiode lower electrode layer 63 is provided above the second gate electrode 53.

With the radiation detector 103, the area of the photodiode main layer 64 can be increased, and the light receiving area of each pixel 151 can be increased.

Fifth Embodiment

Figure 10:
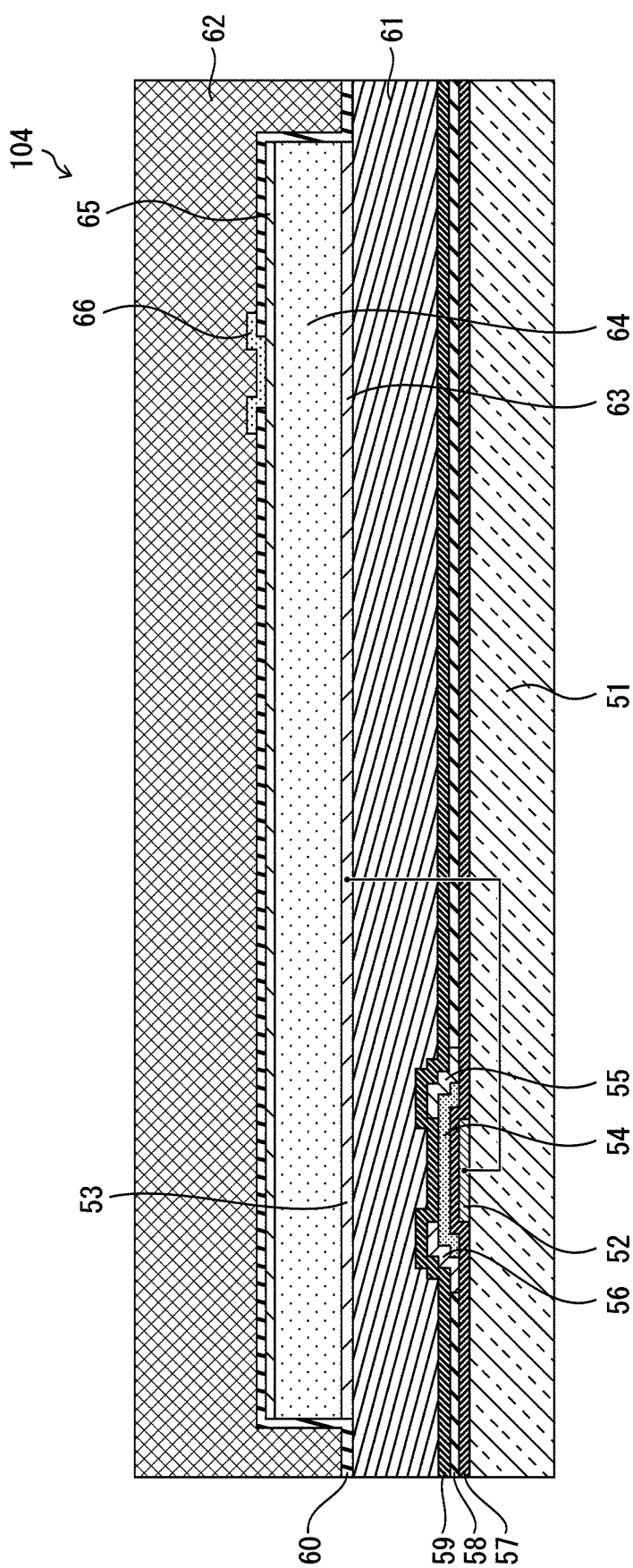
FIG. 10 is a diagram illustrating a cross-sectional structure of a radiation detector according to a fifth embodiment of the present invention.

FIG. 10 is a diagram illustrating a cross-sectional structure of a radiation detector 104 according to a fifth embodiment of the present invention.

A notable difference between the cross-sectional structure of the radiation detector 104 and the cross-sectional structure of the radiation detector 103 is that the second gate electrode 53 and the photodiode lower electrode layer 63 are integrated together.

With the radiation detector 104, the effect produced by the radiation detector 103 can be produced, and the second gate electrode 53 can be fabricated with a simple configuration.

Sixth Embodiment

Figure 11:
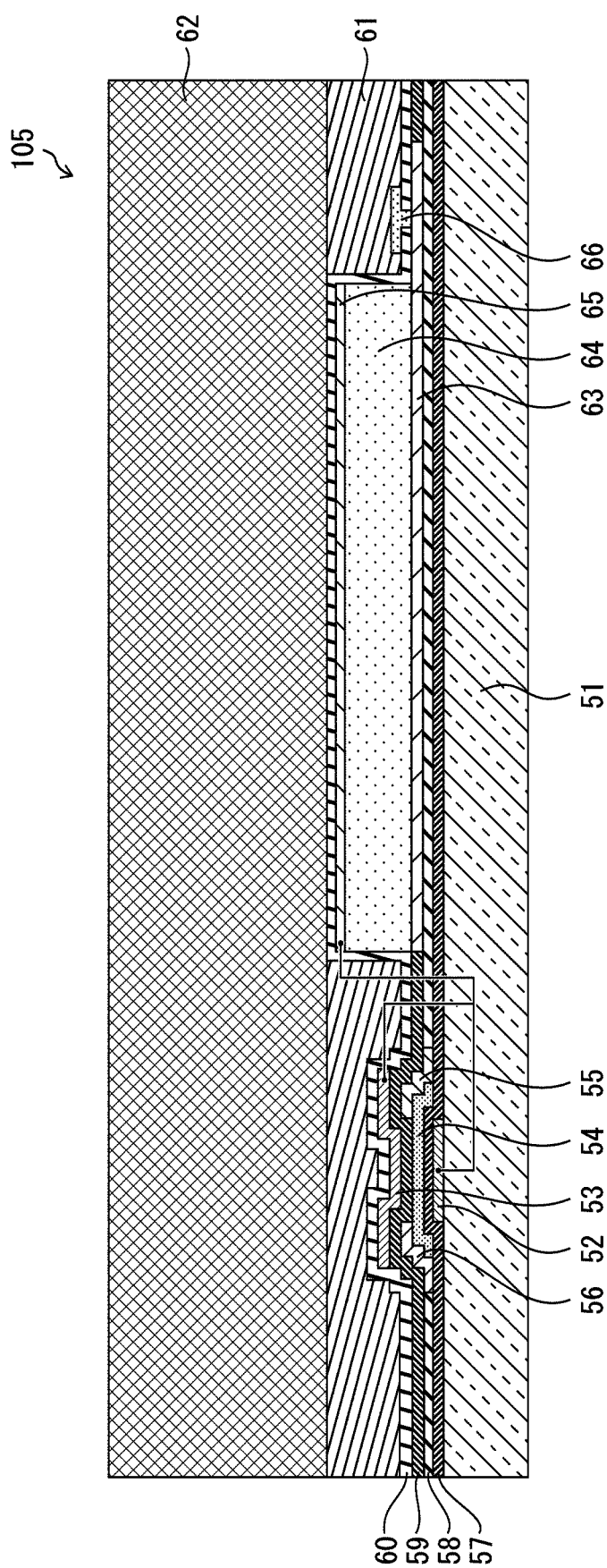
FIG. 11 is a diagram illustrating a cross-sectional structure of a radiation detector according to a sixth embodiment of the present invention.

FIG. 11 is a diagram illustrating a cross-sectional configuration of a radiation detector 105 according to a sixth embodiment of the present invention.

A notable difference between the cross-sectional structure of the radiation detector 105 and the cross-sectional structure of the radiation detector 100 is that the photodiode upper electrode layer 65 is connected to the first gate electrode 52 and the second gate electrode 53. The wiring electrode 66 is accordingly provided on the photodiode lower electrode layer 63 and connected to the photodiode lower electrode layer 63. In the radiation detector 105, the potentials of the first gate electrode 52 and the second gate electrode 53 are the same as that of the photodiode upper electrode layer 65.

With the radiation detector 105, as with the radiation detector 100, variation in the amount of radiation detected can be suppressed. In the radiation detectors 100 and 105, the photodiode 1 includes at least two layers (the n layer 6 and the p layer 7) doped with different impurities, and the first gate electrode 52 may be connected to a layer closer to the glass substrate 51 or a layer farther from the glass substrate 51.

Seventh Embodiment

Figure 12:
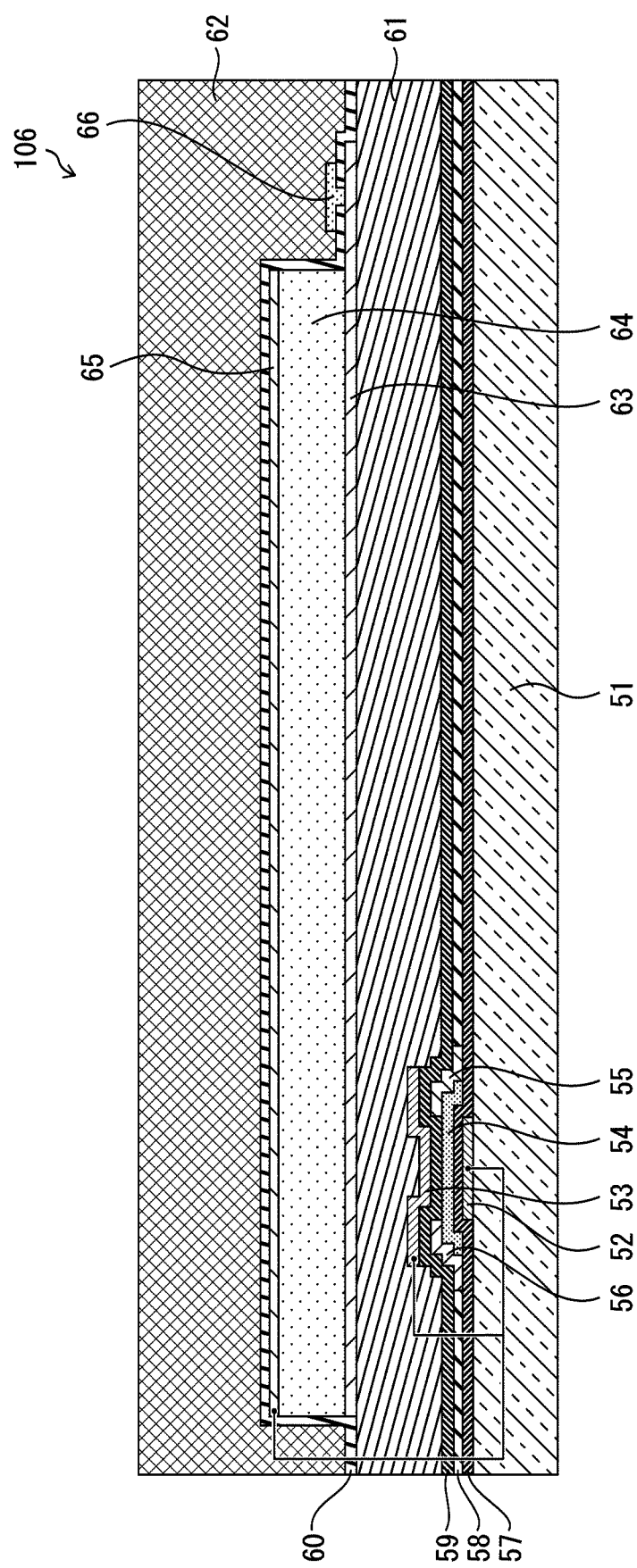
FIG. 12 is a diagram illustrating a cross-sectional structure of a radiation detector according to a seventh embodiment of the present invention.
Figure 13:
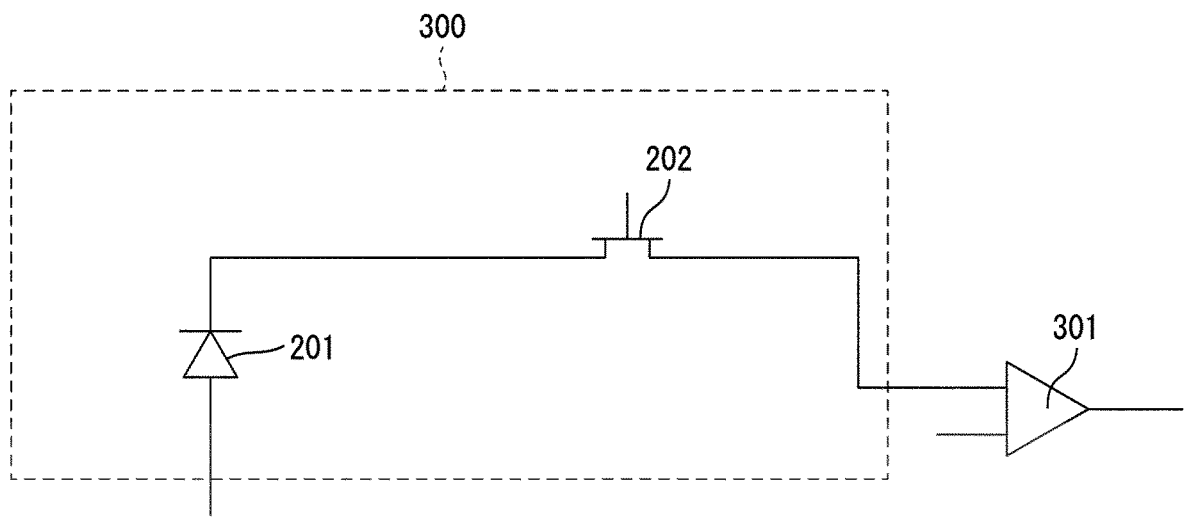
FIG. 13 is a circuit diagram illustrating an example of a PPS according to a conventional technique.
Figure 14:
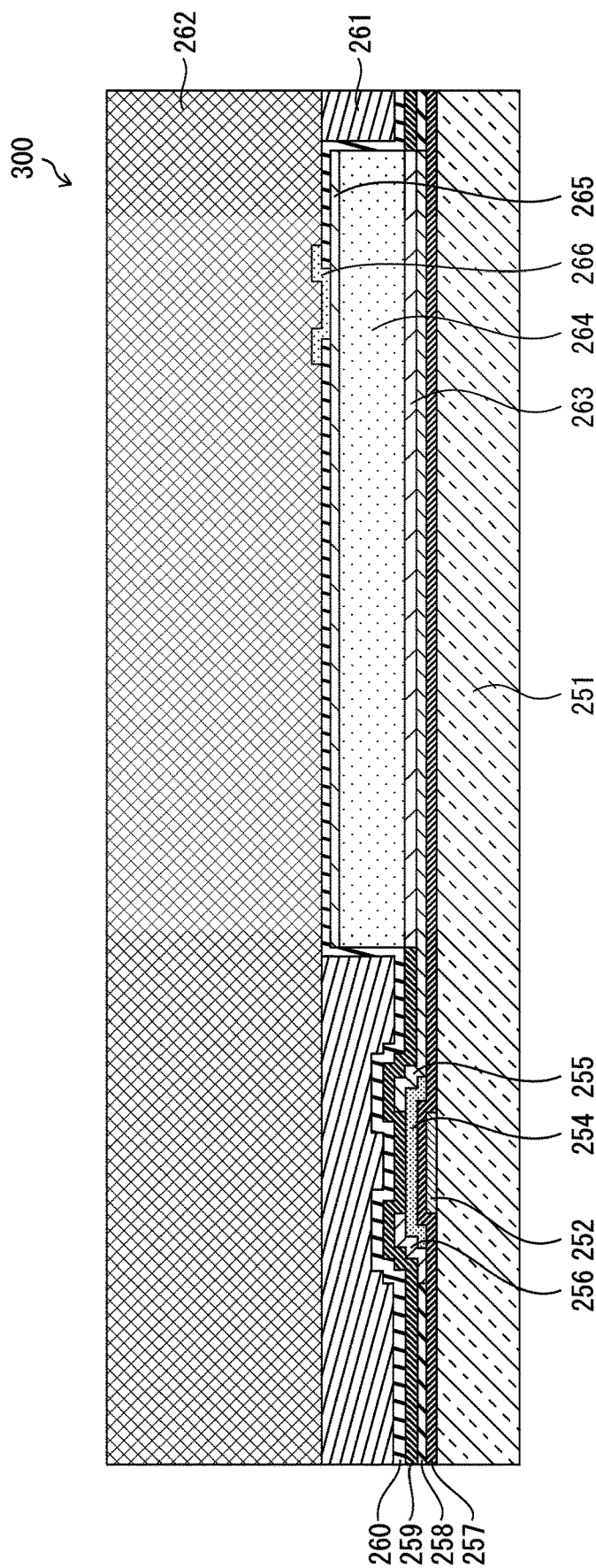
FIG. 14 is a diagram illustrating an example of a cross-sectional structure of the PPS illustrated in FIG. 13.
Figure 15:
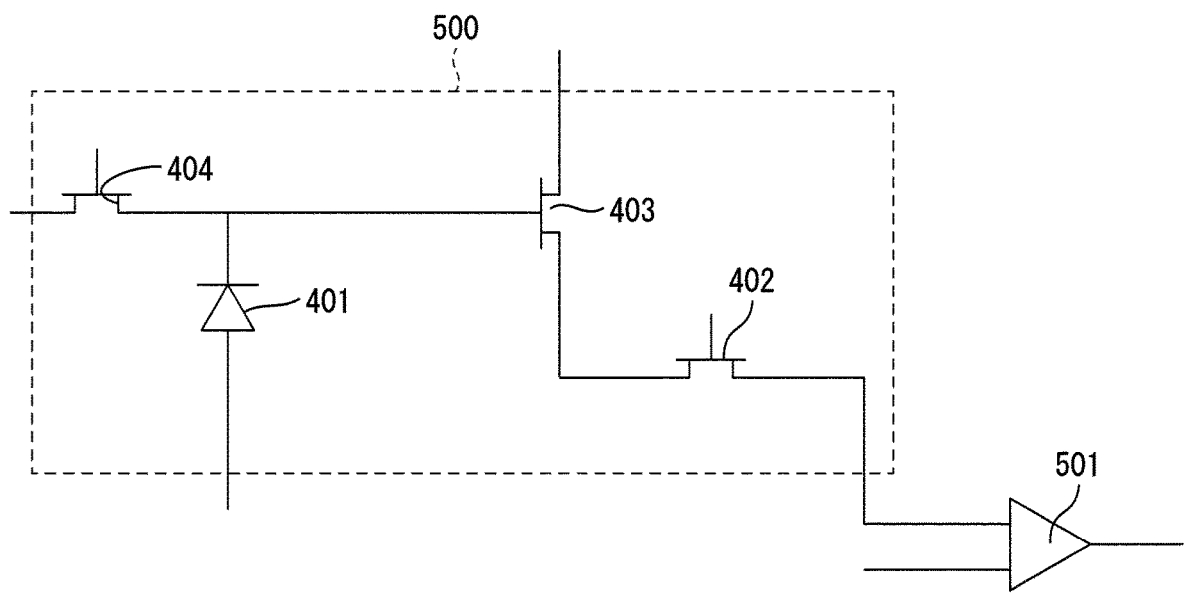
FIG. 15 is a circuit diagram illustrating an example of an APS according to a conventional technique.
Figure 16:
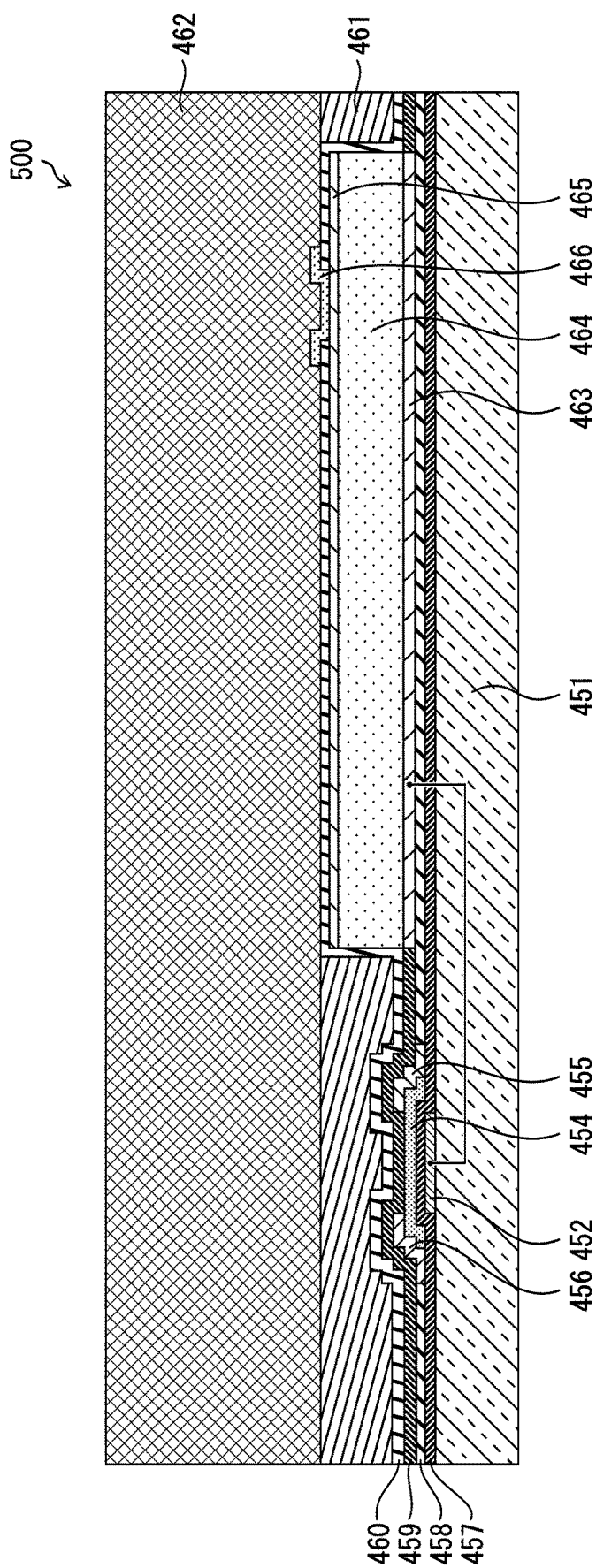
FIG. 16 is a diagram illustrating an example of a cross-sectional structure of the APS illustrated in FIG. 15.

FIG. 12 is a diagram illustrating a cross-sectional structure of a radiation detector 106 according to a seventh embodiment of the present invention.

A notable difference between the cross-sectional structure of the radiation detector 106 and the cross-sectional structure of the radiation detector 105 is that the photodiode lower electrode layer 63 is provided above the second gate electrode 53.

With the radiation detector 106, the area of the photodiode main layer 64 can be increased, and the light receiving area of each pixel 151 can be increased.

Eighth Embodiment

The channel layer 54 preferably includes an oxide semiconductor having a non-amorphous crystal structure. In this case, fluctuation in the threshold voltage of the amplifying transistor 3 can be reduced, and variation in the amount of radiation detected can be suppressed more completely.

Constituent elements of the channel layer 54 preferably include at least In and Zn. In this case, a smaller amplifying transistor 3 can be formed. As a result, the light receiving area can be secured even if photodiodes 1 are densely fabricated, and a device capable of obtaining a high-resolution image with a small amount of radiation can be developed.

In the radiation detectors 100 to 106, an oxide semiconductor oriented along the c-axis is used for the channel layer 54, and the potentials of the first gate electrode 52 and the second gate electrode 53 completely synchronized with each other are specified. As a result, fluctuation in the threshold voltage of the amplifying transistor 3 can be suppressed, and accordingly fluctuation in an amplification factor of the amplifying transistor 3 can be suppressed, thereby achieving stable operation as an APS.

CONCLUSION

A radiation detector according to a first aspect of the present invention includes a light receiving device that receives light obtained from radiation and that converts the light into an electrical signal and an amplifying transistor that amplifies the electrical signal. The amplifying transistor includes a channel layer and a first gate electrode and a second gate electrode that sandwich the channel layer. The first gate electrode is connected to the light receiving device. The second gate electrode is configured to have a same potential as a potential of the first gate electrode.

With this configuration, the second gate electrode functions as a back gate of the amplifying transistor. As a result, the threshold voltage of the amplifying transistor becomes stable, and variation in the amount of radiation detected can be suppressed.

A radiation detector according to a second aspect of the present invention is preferably the radiation detector according to the first aspect in which the light receiving device is a photodiode.

A radiation detector according to a third aspect of the present invention is the radiation detector according to the second aspect further including a substrate (glass substrate 51) for which the photodiode and the amplifying transistor are provided. The photodiode includes at least two layers (the n layer 6 and the p layer 7) doped with different impurities. The first gate electrode is connected to, between the at least two layers, a layer closer to the substrate.

A radiation detector according to a fourth aspect of the present invention is the radiation detector according to the second aspect further including a substrate for which the photodiode and the amplifying transistor are provided. The photodiode includes at least two layers doped with different impurities. The first gate electrode is connected to, between the at least two layers, a layer farther from the substrate.

With the above two configurations, the potentials of the first gate electrode and the second gate electrode can be set the same as the potential of one of the two layers.

A radiation detector according to a fifth aspect of the present invention is preferably the radiation detector according to the third or fourth aspect in which the amplifying transistor is formed on the substrate.

A radiation detector according to a sixth aspect of the present invention is the radiation detector according to any of the first to fifth aspects in which the channel layer includes an oxide semiconductor having a non-amorphous crystal structure.

With this configuration, fluctuation in the threshold voltage of the amplifying transistor can be further reduced, and variation in the amount of radiation detected can be further suppressed.

A radiation detector according to a seventh aspect of the present invention is the radiation detector according to any of the first to sixth aspects in which constituent elements of the channel layer include at least indium and zinc.

With this configuration, a smaller amplifying transistor can be formed. As a result, even if light receiving devices are fabricated densely, a light receiving area can be secured, and an apparatus capable of obtaining high-resolution images with a small amount of radiation can be developed.

The present invention is not limited to the above-described embodiments, and may be modified in various ways within the scope defined by the claims. The technical scope of the present invention also includes embodiments obtained by appropriately combining together technical means disclosed in different embodiments. Furthermore, by combining together technical means disclosed in different embodiments, new technical features can be achieved.

REFERENCE SIGNS LIST 1 photodiode (light receiving device)
2 read transistor 3 amplifying transistor
4 reset transistor
5 i layer
6 n layer
7 p layer
51 glass substrate (substrate)
52 first gate electrode
53 second gate electrode
54 channel layer
55 source electrode
56 drain electrode
57 to 62 insulating film
63 photodiode lower electrode layer (layer closer to substrate between two layers)
64 photodiode main layer
65 photodiode upper electrode layer (layer farther from substrate between two layers)
66 wiring electrode
100 to 106 radiation detector
111 measuring circuit
150 sensor
151 pixel

The invention claimed is:

1. A radiation detector comprising:
a light receiving device that receives light obtained from radiation and that converts the light into an electrical signal; and
an amplifying transistor that amplifies the electrical signal,
wherein the light receiving device and the amplifying transistor are formed on a glass substrate,
wherein the amplifying transistor includes a first gate electrode, a channel layer, and a second gate electrode which are stacked in an order named on the glass substrate,
wherein the light receiving device includes at least two layers which cover the amplifying transistor and which are doped with different impurities from each other,
wherein the first gate electrode is connected to one of the at least two layers of the light receiving device,
wherein the second gate electrode is configured to have a same potential as a potential of the first gate electrode, and
wherein the channel layer includes an oxide semiconductor oriented along a c-axis and having a non-amorphous crystal structure.

2. The radiation detector according to claim 1, wherein constituent elements of the channel layer include at least indium and zinc.

3. A radiation detector comprising:
a light receiving device that receives light obtained from radiation and that converts the light into an electrical signal; and
an amplifying transistor that amplifies the electrical signal,
wherein the light receiving device and the amplifying transistor are formed on a glass substrate,
wherein the amplifying transistor includes a first gate electrode, a channel layer, and a second gate electrode which are stacked in an order named on the glass substrate,
wherein the light receiving device includes at least two layers which cover the amplifying transistor and which are doped with different impurities from each other,
wherein the second gate electrode is a layer closer to a channel layer between the at least two layers,
the first gate electrode and the second gate electrode are connected to each other so that (i) fluctuation in a potential of the second gate electrode and fluctuation in a potential of the first gate electrode, which fluctuations result from accumulation of charge in the light receiving device, are synchronized with each other and (ii) a variation in amount of radiation detected by the radiation detector is suppressed, and
wherein the channel layer includes an oxide semiconductor oriented along a c-axis and having a non-amorphous crystal structure.

4. The radiation detector according to claim 3, wherein constituent elements of the channel layer include at least indium and zinc.

* * * * *